US005611230A

United States Patent [19]

Chelluri et al.

[11] Patent Number: 5,611,230

[45] Date of Patent: Mar. 18, 1997

[54] STRUCTURE AND METHOD FOR COMPACTION OF POWDER-LIKE MATERIALS

[75] Inventors: Bhanumathi Chelluri, Dublin; John P. Barber, Kettering, both of Ohio

[73] Assignee: IAP Research, Inc., Dayton, Ohio

[21] Appl. No.: 368,301

[22] Filed: Jan. 3, 1995

Related U.S. Application Data

[62] Division of Ser. No. 834,148, Feb. 10, 1992, Pat. No. 5,405,574.

[51] Int. Cl.[6] .......... B21D 26/02; B23P 17/04

[52] U.S. Cl. .......... 72/56; 419/38; 29/419.2; 427/458; 505/916; 505/917

[58] Field of Search .......... 29/419.2; 75/236; 419/38, 49, 66; 427/458; 505/916, 917; 72/56

[56] References Cited

U.S. PATENT DOCUMENTS

| | | | |
|---|---|---|---|
| 2,976,907 | 3/1961 | Harvey et al. | 153/10 |
| 3,346,914 | 10/1967 | Sandstrom et al. | 18/5 |
| 3,347,074 | 10/1967 | Eilers et al. | 72/56 |
| 3,374,074 | 10/1967 | Eilers et al. | 72/56 |
| 4,170,887 | 10/1979 | Baranov | 72/56 |
| 4,297,388 | 10/1981 | Kumar et al. | 427/47 |
| 4,717,627 | 1/1988 | Nellis et al. | 428/552 |
| 4,762,754 | 8/1988 | Nellis et al. | 428/552 |
| 4,939,121 | 7/1990 | Rybka | 505/1 |
| 4,962,656 | 10/1990 | Kunerth et al. | 72/56 |
| 5,004,722 | 4/1991 | Tallman | 505/1 |
| 5,030,614 | 7/1991 | Hollinder et al. | 505/1 |
| 5,057,486 | 10/1991 | Arendt et al. | 505/1 |
| 5,079,225 | 1/1992 | Holloway | 505/1 |
| 5,096,880 | 3/1992 | Rybka | 505/1 |
| 5,101,560 | 4/1992 | Leonard et al. | 29/890.032 |
| 5,162,296 | 11/1992 | Yamazaki | 505/1 |
| 5,250,255 | 10/1993 | Sagawa et al. | 419/39 |
| 5,262,396 | 11/1993 | Yamazaki | 89/1.11 |

OTHER PUBLICATIONS

*Melt–Textured Growth of Polycrystaline,* Physical Review B, vol. 37, No. 13, May 1, 1988, S. Gin, et al.

*High–Field Critical Current Densities,* 1989 Applied Physics Letters, p. 2441, prepared by K. Heine, et al.

*Hot Extrusion of High–Temperature Superconducting Oxides,* American Ceramic Bulletin, May 1991, p. 813, by Uthamalingam Balachandran.

*Crystallography oriented superconducting* $bi_2Sr_2CaCu_2O_8$*by shock compaction of prealigned powder,* Applied Physics Letters 57, Jul. 2, 1990, p. 93, by C. L. Seaman, et al.

*Metal Matrix High–Temperature Superconductor,* Advanced Materials and Processes Inc.., Metal Progress, Oct. 1987, p. 37, by L. E. Murr, et al.

*Densification of* $YBa_2Cu_2O_{7-8}$ *by uniaxial pressure sintering,* Cryogenics, May 1990, vol. 30, by S. L. Town, et al.

German Publication *Planseeberichte fur Pulvermetallurgie, Pulverdichten mit Magnetimpulsen,* dated 1976.

*Electromagnetic Forming,* Pulsed Power Lecture Series, Lecture No. 36 by J. Bennett and M. Plum.

*Primary Examiner*—Peter A. Nelson
*Attorney, Agent, or Firm*—Jacox, Meckstroth & Jenkins

[57] ABSTRACT

Structure and a method for producing very dense bodies of material from particulate materials. A particulate material is placed within an electrically conductive container. A solenoid or coil encompasses the electrically conductive container, and a large magnitude of electrical current is caused to flow through the solenoid or coil. As the electrical current flows through the solenoid or coil, large magnitudes of magnetic pressures are created upon the electrically conductive container, and the electrically conductive container is compressed, and the transverse dimension thereof is reduced. Thus, the particulate material within the electrically conductive container is very firmly compacted, and a rigid body of material is provided. Any one of numerous types of particulate material may be employed. For example, a body of electrical superconductive material of any desired size and shape can be produced by this method by the use of superconducting particulate material.

5 Claims, 1 Drawing Sheet

POWER SUPPLY
20 22 24 26 28 30 32 34 36 38 40 44

POWER SUPPLY
20
22
24
26
28
30
32
34
36
38
40
44

52
50
54
55
50a
52
57
50a
52
56
80
74
76
76
72
68
67
66
POWER SOURCE
60
64
62
52
84
85
86

STRUCTURE AND METHOD FOR COMPACTION OF POWDER-LIKE MATERIALS

RELATED APPLICATION

This application is a division of application Ser. No. 07/834,148, filed Feb. 10, 1992, now U.S. Pat. No. 5,405,574.

BACKGROUND OF THE INVENTION

Several methods have been employed for forming particulate or powder-like materials into a unitary firmly compacted body of material.

Powdered metal bodies have been formed by means of pressure and heat. Such a method has also been used for forming unitary bodies from other powder or particulate materials.

A problem has specifically existed with regard to forming superconducting powders into a unitary firmly compacted body. Ceramic superconducting powders are normally prepared by proportioning the specific quantities of selected oxides. The combination is then thoroughly mixed by conventional means and then fired at elevated temperatures in suitable gaseous atmospheres. The induced solid state reaction causes the formation of the desired ceramic compositions and lattice structures.

In ceramic superconductors, the superconductivity within individual crystallites is proximity coupled to neighboring grains. Consequently, the orientation and coupling between crystallites are key factors affecting the current carrying capacity of the bulk ceramic superconductors. Voids, cracks, and grain boundaries act as weak links between crystallites and reduce the critical currents within the bulk material. Therefore, a technique which produces dense ceramics with good intergrain coupling and by which the material is formable into desired shapes to yield a required superconducting characteristic is of significant value.

At the present time several methods are used for obtaining high critical current densities in bulk superconducting materials.

One method employed is that of melt textured growth of polycrystalling material. This method is discussed in a paper included in Volume 37, No. 13, May 1, 1988, Physical Review B, S. Gin, et al, entitled: *Melt-Textured Growth of Polycrystaline*. This method consists of heating a bulk specimen of the high temperature material in a furnace to temperatures at which partial melting occurs. A temperature gradient is maintained in the furnace, and the superconductor is melted and recrystallised as the specimen is passed through the hot zone. Highly textured material is produced through this method and at present is shown to yield high Jc values. This method is generally limited to the processing of small length samples.

Another method is that of placing powder in a tube. This "powder in tube" method is discussed in a paper 1989 Applied Physics Letters, page 2441, prepared by K. Heine, et al, entitled: *High-Field Critical Current Densities*. In the "powder in tube" method, mechanical deformation is used to align plate-like particles of bismuth based superconductors. The powder is loaded into a tube of silver material and the assembly is compacted by swaging, drawing or rolling. A silver sheath provides a path to shunt currents across any defects. The material is subsequently heat treated to obtain the optimum superconductor characteristics.

However, as a result of the nature of varied mechanical operation involved in the two methods discussed above, reproducing the many processing steps repeatedly during fabrication of long lengths of wires and tapes remains unsatisfactory.

Another method of compaction is that of hot extrusion. This method is discussed in an article entitled: *Hot Extrusion of High-temperature Superconducting Oxides* by Uthamalingam Balachandran, et al, American Ceramic Bulletin, May 1991, page 813.

Another method is discussed in U.S. Pat. No. 5,004,722, *Method of Making Superconductor Wires By Hot Isostatic Pressing After Bending*.

Another compaction technique which has been employed pertains to a shock method. This method is discussed in an article entitled: *Crystallographically oriented superconducting $Bi_2Sr_2CaCu_2O_8$ by shock compaction of prealigned powder* by C. L. Seaman, et al, in Applied Physics Letters 57, dated Jul. 2, 1990, page 93.

Another method of compaction is that known as an explosive method, discussed in an article entitled: *Metal Matrix High-Temperature Superconductor*, by L. E. Murr, et al, in Advanced Materials and Processes Inc. Metal Progress, October 1987, page 37.

These methods are limited in value because they are generally applicable only to production of small body sizes.

The application of large uniaxial static pressures at elevated temperatures is discussed in an article entitled: *Densification of $YBa_2Cu_2O_{7\ 8}$by uniaxial pressure sintering*, by S. L. Town, et al, in Cryogenics, May 1990, Volume 30.

The use of electromagnetic forming for the purpose of attachment is discussed in a paper entitled: *Electromagnetic Forming*, by J. Bennett and M. Plum, published in Pulsed Power Lecture Series, Lecture No. 36.

However, processing of long lengths of homogenous and high quality superconducting tapes or wires by the processes discussed above has not been realized.

It is an object of this invention to provide a method and means for producing high density bodies by the use of powder-like and/or particulate materials.

It is another object of this invention to provide a method and means for producing electrical conductors by the use of powder-like or particulate materials.

It is another object of this invention to provide a method and means for producing high quality and continuous superconducting electrical conductors such as wires and tapes.

It is another object of this invention to provide such a method which can-be consistently precisely duplicated in the quality of production.

Other objects and advantages of this invention reside in the construction of parts, the combinations thereof, and the methods employed, as will become more apparent from the following description.

SUMMARY OF THE INVENTION

In this invention, powder-like and/or particulate materials or the like are compacted into high density bodies. The high density bodies can be of various shapes and sizes, and may, for example, be bodies such as rods, tapes, tubes, or plates or any other suitably shaped or desirably shaped bodies.

The method and structure of this invention applies pressures generated by non-contact electromagnetic forces. These electromagnetic pressures are generated by employing suitably shaped coils, such as solenoids or the like which have the necessary current carrying capacity. In this process a suitable electrically conductive container is encompassed by such a coil or solenoid. Within the electrically conductive container powder-like material is enclosed. When high magnitudes of electrical current are passed through the solenoid or coil, very high pressures are applied to the electrically conductive container, and the electrically conductive container is reduced in transverse dimensions. Thus, the powder-like material within the electrically conductive container is compacted into a body of high density.

In one embodiment of this invention superconducting powders are placed upon an electrically conductive strip, and the strip is formed into a tubular member, thus enclosing the superconducting powders. The tubular member is encompassed by a solenoid or coil. High current levels are passed through the solenoid or coil, and a high magnitude of resulting electromagnetic pressure is applied to the tubular member. The transverse dimensions of the tubular member are significantly reduced and the superconductive powder within the tubular member is thus firmly compacted. If desired, this process can be performed in a continuous manner, so that an elongate conductor of superconductive material is produced. The compaction method of this invention is capable of producing wire or tape of normal electrical conducting materials or of superconducting electrical materials.

DETAILED DESCRIPTION OF THE PREFERRED EMBODIMENT

Figures 1, 2:
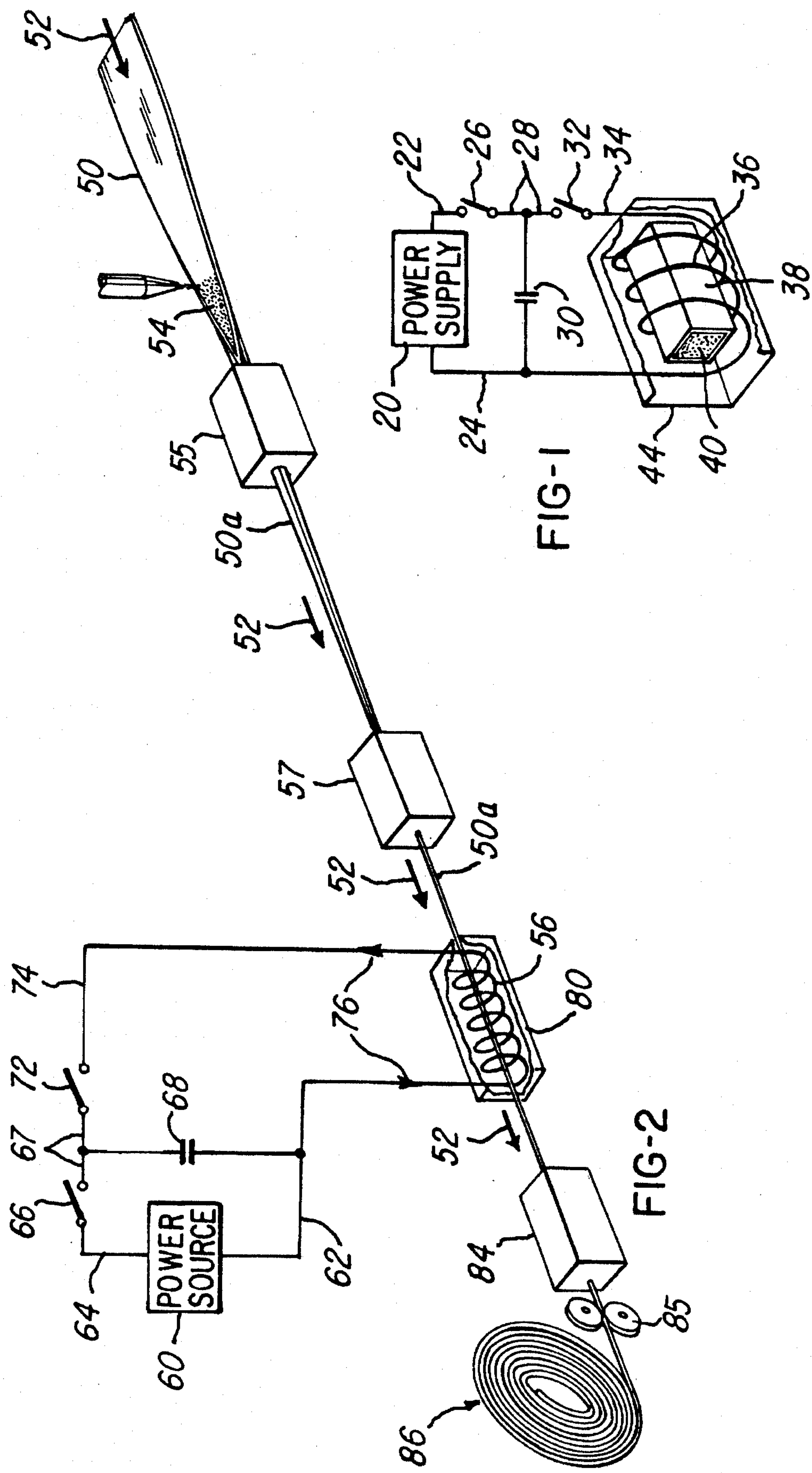
FIG. 1 is a perspective diagrammatic view illustrating a structure and a method of compaction of powder-like materials in accordance with this invention.
FIG. 2 is a perspective diagrammatic type of view illustrating a method and structure in accordance with this invention for producing in a continuous process an elongate member, which may be referred to as a wire, or tape, or the like. The process illustrated can be employed for production of an elongate member of superconductive material.

FIG. 1 shows a direct current power supply 20 to which is connected electric conductors 22 and 24. Connected to the conductor 22 is a switch 26 which is also connected to a conductor 28. The conductor 28 and the conductor 24 have joined therebetween a capacitor 30. The conductor 28 is also connected to a switch 32 which is also connected to a conductor 34. The conductor 24 and the conductor 34 are connected to a solenoid or coil 36 which encompasses an electrically conductive container 38. The electrically conductive container 38 is shown as being rectangular in transverse dimensions. However, the electrically conductive container 38 may be of any suitable or desired shape and size. The electrically conductive container 38 may be of any suitable electrically conductive material, such as, for example, of silver material.

Within the electrically conductive container 38 is a quantity of powder material 40. The powder material 40 completely fills the electrically conductive container 38 and is firmly positioned therewithin.

In carrying out the process of this invention, the switch 26 is closed, and the capacitor 30 is charged from the power supply 20. After the capacitor 30 is completely charged, the switch 26 is opened and the switch 32 is closed. When the switch 32 is closed a large quantity of electrical current flows from the capacitor 30 through the solenoid or coil 36. When electrical current flows through the coil or solenoid 36 magnetic pressure is applied upon the electrically conductive container 38. This pressure acts inwardly upon the electrically conductive container 38, and the transverse dimensions of the electrically conductive container 38 are reduced. Thus, compression occurs within the electrically conductive container 38, and the powder-like material 40 within the electrically conductive container 38 is compressed and compacted. Thus, the powderous material 40 within the electrically conductive container 38 becomes a dense body.

As an example or illustration, the electrically conductive container 38 may have a transverse dimension of less than one inch or several inches, and current flow through the solenoid 36 may be in the order of about 100,000 amperes at a voltage of about 4,000 volts. It is to be understood, of course, that other magnitudes of current may be employed as found to be suitable in accordance with the size and physical characteristics of the electrically conductive container 38 and the physical characteristics and volume of the powder-like material 40. It is also to be understood that when the powder-like material 40 has good electrically conductive properties, the container thereof may not need to be electrically conductive for compaction of the powder-like material in accordance with the method of this invention.

Due to the fact that the solenoid or coil 36 tends to expand radially as current flows therethrough, suitable means are employed to restrain the coil 36 against lateral expansion as current flows therethrough. For example, as shown, a rigid wall 44 closely encompasses the coil 36 and restrains the coil 36 against expansion as current flows therethrough.

FIG. 2 illustrates structure and a method of the construction of an elongate body, such as a wire or tape or rod in accordance with this invention. A strip of electrically conductive material 50 in a flat condition is moved longitudinally as illustrated by arrows 52. A powderous material 54 having desired physical or electrical properties is poured upon the strip 50. When a superconductive body is desired, the powderous material 54 is superconductive material. Thus, the strip 50 carries the powder-like material 54.

Then by any suitable means, such as by means of a forming unit 55, the strip 50 is formed into a tubular member **50*a*, as the tubular member 50*a* encloses and carries the powder-like material 54. Then the diameter of the tubular member 50*a* is reduced as the tubular member 50*a* is drawn through a drawing unit 57. Thus, the diameter of the tubular member 50*a* is reduced as elongation of the tubular member 50*a* occurs. Thus, a degree of compaction of the powder-like material occurs as drawing and elongation of the tubular member 50*a*** occurs.

Then the tubular member **50*a* is moved into the confines of a solenoid or a coil 56. The coil 56 is energized from a power source 60. Electrical conductors 62 and 64 are connected to the power source 60. Joined to the conductor 64 is a switch 66. A conductor 67 is also connected to the switch 66. Connected to the conductors 62 and 67 is a capacitor 68. Also connected to the conductor 67 is a switch 72. Also connected to the switch 72 is a conductor 74. The conductor 74 and the conductor 62 are joined to the solenoid or coil 56**.

In accordance with the method of this invention, the capacitor 68 is charged from the power source 60 as the switch 66 is closed. Then the switch 66 is opened, and the switch 72 is closed so that a large magnitude of current flows from the capacitor 68 through the coil or solenoid 56, as illustrated by arrows 76. The flow of current through the coil 56 may be in the order of several thousand amperes. When this flow of current through the solenoid or coil 56 occurs a high magnitude of magnetic pressure is applied to the tubular member 50*a*. The pressure upon the tubular member 50*a* causes reduction of the transverse dimension of the tubular member 50*a*. Thus, the powder material 54 within the tubular member 50*a* becomes very firmly compacted. Due to the fact that the coil 56 tends to expand during current flow therethrough, a wall 80 closely encompasses the coil 56 and restrains the coil 56 against radial and axial expansion.

If desired, after the tubular member 50*a* passes through the electrical coil 56, the tubular member 50*a*, with the powderous material 54 compacted therewithin, may pass through a sintering operation 84. The sintering operation 84 improves the properties of the compacted powder-like material 54. Power driven roller means 85 are shown for moving the tubular member 50*a*.

By this means and method, a desired elongate body can be produced. By this means and method a superconducting wire or tape or the like can be produced. As illustrated, the process can be a continuous process. By continuously moving the tubular member 50*a* through the solenoid 56 while current flows through the solenoid 56, continuous lengths of tubes are compacted, and a continuous length of electrical conductor of superconducting material is produced. Thus, superconductors of any desired shape and size and/or length can be produced in a single operation or in a continuous operation or in plurality of operations. Long lengths of superconducting material can be repeatedly and precisely produced by this non-contact method. After processing, the wire of superconducting material may be wound into a coil 86, as shown in FIG. 2.

The method and structure shown in FIG. 2 have been found to be successful in creating a wire-like conductor of superconducting material. As an example or illustration, a wire of superconducting material was produced in which the strip 50 was approximately one-half inch in width and approximately fifteen thousandths of an inch in thickness. The superconductive powder material 54 employed was Bi(Pb)SrCaCuO. The current flow through the coil 56 was in the order of about one hundred thousand amperes. After travel through the coil 56 the transverse dimension of the tubular member 50*a* was about one-eighth of an inch.

It is to be understood that the method of this invention can be employed in compacting most types of powder-like or powderous materials, such as ceramic compounds, ceramic and metal composites, metals, metal alloys, and metal compounds.

Although the preferred embodiment of the structure and method for compaction of powder-like materials of this invention has been described, it will be understood that within the purview of this invention various changes may be made in the electrical circuitry and in the current flow therethrough, or in the form, details, proportion and arrangement of parts, the combination thereof, and the method of operation, which generally stated consist in a structure and method within the scope of the appended claims.

The invention having thus been described, the following is claimed:

1. A structure for producing a high density body, comprising an electrically conductive container having a given dimension, said electrically conductive container being capable of receiving the body of particulate material having a given density, an electrically conductive coil surrounding the electrically conductive container, an electrical supply source for providing electrical energy through the electrically conductive coil, said electrically conductive container being separated from said electrical supply source, whereby electromagnetic pressure is applied to the electrically conductive container and the dimension of the electrically conductive container is changed so that the body of particulate material within the electrically conductive container is compressed and the density of the body of particulate material is increased to produce said high density body in the absence of direct contact between said conductor and said supply source.

2. The structure of claim 1 which includes means for relative movement between the electrically conductive container and the electrically conductive coil.

3. The structure of claim 1 in which the particulate material in the body thereof is a powder material.

4. The structure of claim 1 in which the body of particulate material thereof is electrically superconductive particulate material.

5. The structure of claim 1 in which the of particulate material body thereof is electrically conductive particulate material.

* * * * *

UNITED STATES PATENT AND TRADEMARK OFFICE
CERTIFICATE OF CORRECTION

PATENT NO. : 5,611,230

DATED : March 18, 1997

INVENTOR(S) : Chelluri et al.

It is certified that error appears in the above-indentified patent and that said Letters Patent is hereby corrected as shown below:

On the title page, item [56], References Cited, U.S. Patent Documents, line 4, please delete "3,374,074 10/1967 Eilers et al. ...72/56" and insert --3,374,074 3/1968 Russell et al. ...65/2-- therefor.

On the title page, item [56], Other Publications, line 9, please delete "*bi*$_2$*Sr*$_2$*CaCu*$_2$*O*$_8$*by shock compaction of prealigned powder,*" and insert --*Bi*$_2$*Sr*$_2$*CaCu*$_2$*O*$_8$ *by Shock Compaction of Prealigned Powder,*-- therefor.

On the title page, item [56], Other Publications, line 13, please delete "Inc..," and insert --Inc.,-- therefor.

Claim 1, column 6, line 20, please delete "the body", and insert --a body-- therefor.

Claim 1, column 6, line 22, please delete "the electrically", and insert --said electrically-- therefor.

In claim 1, column 6, line 23, please delete "through the", and insert --through said-- therefor.

Claim 1, column 6, line 26, please delete "to the", and insert --to said-- therefor.

Claim 1, column 6, line 27, please delete "of the", and insert --of said-- therefor.

Claim 1, column 6, line 28, please delete "the body", and insert --said body-- therefor.

UNITED STATES PATENT AND TRADEMARK OFFICE

CERTIFICATE OF CORRECTION

PATENT NO. : 5,611,230

DATED : March 18, 1997

INVENTOR(S) : Chelluri et al.

It is certified that error appears in the above-indentified patent and that said Letters Patent is hereby corrected as shown below:

Claim 1, column 6, line 29, please delete "within the", and insert --within said-- therefor.

Claim 1, column 6, line 30, please delete "the body", and insert --said body-- therefor.

Claim 2, column 6, line 35, please delete "between the", and insert --between said-- therefor.

Claim 2, column 6, line 36, please delete "and the", and insert --and said-- therefor.

Claim 4, column 6, line 39, please delete "the body", and insert --said body-- therefor.

Claim 5, column 6, line 42, please delete "which the of", and insert --which said body of-- therefor.

UNITED STATES PATENT AND TRADEMARK OFFICE

CERTIFICATE OF CORRECTION

PATENT NO. : 5,611,230

DATED : March 18, 1997

INVENTOR(S) : Chelluri et al.

It is certified that error appears in the above-indentified patent and that said Letters Patent is hereby corrected as shown below:

Claim 5, column 6, line 43, please delete "material body thereof", and insert --material thereof-- therefor.

Signed and Sealed this

Twenty-eighth Day of October, 1997

Attest:

BRUCE LEHMAN

*Attesting Officer* *Commissioner of Patents and Trademarks*